(12) United States Patent  
Donkers et al.

(10) Patent No.: US 9,305,789 B2  
(45) Date of Patent: Apr. 5, 2016

(54) SEMICONDUCTOR DEVICE COMPRISING AN ACTIVE LAYER AND A SCHOTTKY CONTACT

(71) Applicant: NXP B.V., Eindhoven (NL)

(72) Inventors: Johannes Josephus Theodorus Marinus Donkers, Eindhoven (NL); Stephan Bastiaan Simon Heil, Eindhoven (NL); Jos aan de Stegge, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/693,118

(22) Filed: Apr. 22, 2015

(65) Prior Publication Data

US 2015/0325667 A1    Nov. 12, 2015

(30) Foreign Application Priority Data

May 8, 2014 (EP) .................................. 14167589

(51) Int. Cl.
*H01L 29/00* (2006.01)
*H01L 21/285* (2006.01)
*H01L 21/283* (2006.01)
*H01L 29/47* (2006.01)
*H01L 29/20* (2006.01)

(52) U.S. Cl.
CPC ........ *H01L 21/28581* (2013.01); *H01L 21/283* (2013.01); *H01L 29/2003* (2013.01); *H01L 29/47* (2013.01); *H01L 29/475* (2013.01); *H01L 2924/01022* (2013.01); *H01L 2924/01074* (2013.01)

(58) Field of Classification Search
CPC .............. H01L 29/47; H01L 2924/01074; H01L 2924/01022
See application file for complete search history.

(56) References Cited

U.S. PATENT DOCUMENTS

| 2003/0080355 | A1* | 5/2003 | Shirai | H01L 29/475 257/200 |
| 2006/0065908 | A1* | 3/2006 | Beach | H01L 29/2003 257/107 |
| 2006/0157735 | A1 | 7/2006 | Kanamura et al. | |
| 2007/0108547 | A1* | 5/2007 | Zhu | H01L 21/28581 257/471 |
| 2009/0146191 | A1* | 6/2009 | Green | H01L 21/28587 257/280 |
| 2011/0215338 | A1* | 9/2011 | Zhang | H01L 29/1608 257/73 |
| 2012/0146090 | A1* | 6/2012 | Lui | H01L 29/8613 257/139 |
| 2013/0032809 | A1* | 2/2013 | Allen | H01L 29/47 257/73 |
| 2013/0075808 | A1* | 3/2013 | Calafut | H01L 27/06 257/328 |
| 2013/0168688 | A1* | 7/2013 | Lee | H01L 29/2003 257/76 |

(Continued)

FOREIGN PATENT DOCUMENTS

EP      0 402 061 A2    12/1990

OTHER PUBLICATIONS

Donkers et al. 600V-900V GaN-on-Si Process Technology for Schottky Barrier Diodes and Power Switches Fabricated in a Standard Si-Production Fab, CS MANTECH Conf., pp. 259-262 (May 2013).

(Continued)

*Primary Examiner* — Ngan Ngo
(74) *Attorney, Agent, or Firm* — Rajeev Madnawat

(57) ABSTRACT

A semiconductor device comprising at least one active layer on a substrate and a a Schottky contact to the at least one active layer, the Schottky contact comprising a body of at least titanium and nitrogen that is electrically coupled with the at least one active layer.

7 Claims, 2 Drawing Sheets

(56) References Cited

U.S. PATENT DOCUMENTS

| | | | | |
|---|---|---|---|---|
| 2013/0248996 A1* | 9/2013 | Ogasawara | H01L 27/0629 | 257/334 |
| 2014/0117487 A1* | 5/2014 | Nagai | H01L 29/0684 | 257/471 |
| 2014/0145213 A1* | 5/2014 | Henning | H01L 29/8611 | 257/77 |
| 2014/0197422 A1* | 7/2014 | Wada | H01L 29/872 | 257/77 |
| 2014/0252376 A1* | 9/2014 | Itoh | H01L 29/0619 | 257/77 |
| 2014/0264373 A1* | 9/2014 | Beach | H01L 29/2003 | 257/76 |
| 2014/0284754 A1* | 9/2014 | Yamamoto | H01L 23/49551 | 257/487 |
| 2014/0306232 A1* | 10/2014 | Donkers | H01L 21/28575 | 257/76 |
| 2014/0332882 A1* | 11/2014 | Lui | H01L 29/7839 | 257/334 |
| 2015/0129896 A1* | 5/2015 | Kawakami | H01L 29/47 | 257/77 |
| 2015/0130013 A1* | 5/2015 | Husken | H01L 29/872 | 257/472 |
| 2015/0171203 A1* | 6/2015 | Handa | H01L 29/2003 | 257/76 |
| 2015/0228808 A1* | 8/2015 | Liao | H01L 29/872 | 257/484 |
| 2015/0325698 A1 | 11/2015 | Donkers et al. | | |

OTHER PUBLICATIONS

Kawanago, T. et al., "Gate Technology Contributions to Collapse of Drain Current in AlGaN/GaN Schottky HEMT", IEEE Trans. Electron Devices, vol. 61, No. 3, pp. 785-792 (Mar. 2014).

Ao, J. et al. "Schottky Contacts of Refractory Metal Nitrides on Gallium Nitride Using Reactive sputtering", VACUUM, vol. 84., No. 12, pp. 1439-1443 (Jun. 1, 2010).

Lee, C. et al. Study of Titanium Tungsten Nitride and Tungsten Nitride Schottky Contacts on n-GaN, The Japan J. of applied physics, vol. 42, part 1, No. 7, pp. 4193-4196 (Jul. 1, 2003).

Extended European Search Report for EP Patent Appln. No. 14176284.9 (Jun. 19, 2015).

* cited by examiner

SEMICONDUCTOR DEVICE COMPRISING AN ACTIVE LAYER AND A SCHOTTKY CONTACT

CROSS-REFERENCE TO RELATED APPLICATIONS

This application claims the priority under 35 U.S.C. §119 of European patent application no. 14167589.2, filed on May 8, 2014, the contents of which are incorporated by reference herein.

The present invention relates to a semiconductor device comprising at least one active layer such as a GaN layer on a substrate and a Schottky contact to the at least one active layer. The present invention further relates to a method of manufacturing such a semiconductor device.

Group III-V nitrides such as Gallium Nitride (GaN) have drawn interest as promising materials for high-temperature and high-power electronics. Future high-efficiency power converters require fast switching, low conduction loss devices that can handle high voltages. GaN is a good candidate for voltages up to 1 kV and shows excellent switching behaviour in Schottky diodes and in high-electron mobility transistors (HEMTs). Thanks to the advancements in Gallium Nitride on Silicon (GaN-on-Si) epitaxy, the semiconductor industry is now actively combining III-V specific device expertise with low-cost high-volume Si main-stream production facilities.

One of the key considerations for main-stream Silicon compatibility is the choice of metals used and as the technology advances, more stringent demands will be made on the reproducibility, uniformity, thermal stability, and high temperature operation of GaN-based semiconductor devices.

Semiconductor devices may include a Schottky contact, which typically comprises a nickel (Ni) layer in contact with the at least one active layer of the semiconductor device.

According to a first aspect of the invention we provide a semiconductor device comprising at least one active layer on a substrate and a Schottky contact to the at least one active layer, the Schottky contact comprising a body of at least titanium and nitrogen that is electrically coupled with the at least one active layer.

This is advantageous as the Schottky metal that forms the Schottky barrier with the active layer is formed of TiN rather than Nickel. TiN has been found to be an effective Schottky metal that is substantially stable during processing. The body, which may form the bulk of the contact, may be in physical contact with the at least one active layer or electrically coupled thereto.

The body may comprise a titanium, tungsten and nitrogen. In particular the body may be of titanium tungsten nitride TiW(N) in contact with the at least one active layer.

The body of the Schottky contact may be deposited by Physical Vapour Deposition (PVD).

The Schottky contact may comprise a stack of sub-layers including a first Ti sub-layer on the at least one active layer and a TiW(N) layer. The Schottky contact may comprise a Ti sub-layer on the at least one active layer, a first TiW sub-layer, a second TiW sub-layer, and a TiW(N) sub-layer in-between the first and second TiW sub-layers.

This may be the resulting structure from a process in which nitrogen is gradually introduced to and removed from the reactants in a reaction chamber of e.g. a sputter deposition tool.

The TiW(N) sub-layer preferably has a thickness exceeding the combined thickness of the first and second TiW sub-layers such that the properties of the sub-layer stack are dominated by the TiW(N) sub-layer.

The Ti sub-layer may be thicker than the first TiW sub-layer and/or the second TiW sub-layer.

The Schottky contact may comprise a stack having an active layer portion adapted to be coupled to the active layer and a connection portion coupled to the active layer portion for providing a connection to the Schottky contact, wherein the body forms the active layer portion. The connection portion may be arranged on the active layer portion opposite the active layer. Thus, the active layer portion may be in physical contact with the active layer and the connection portion may provide a lower resistance portion of the stack for advantageous electrical properties of the Schottky gate. The connection portion may be thicker than the active layer portion.

The connection portion may comprise Aluminium.

The device may comprise a backend metal layer on the Schottky contact. In particular, the backend metal layer may contact, and may only contact, the connection portion of the Schottky contact. The backend metal layer may comprise Aluminium. The backend metal layer may provide a connection point to/from the Schottky contact of the device.

The Schottky contact may be laterally delimited by an electrically insulating material, which may comprise a dielectric material. Optionally, the electrically insulating layer comprises, at least in part, silicon nitride or silicon oxide. Optionally, the electrically insulating layer comprises a sub-layer of silicon nitride formed on a passivation layer and a sub-layer of silicon oxide formed on the sub-layer of silicon nitride.

The semiconductor device may include a further contact, the further contact comprising one of a source and drain contact. The semiconductor device may include two further contacts, a source contact and a drain contact.

Although the present invention can be applied in any suitable semiconductor device, the present invention is particularly suitable for application in a semiconductor device comprising a gallium nitride (GaN) active layer. An AlGaN layer may separate the GaN layer from the metal of the Schottky contact of the semiconductor device. The active layer may be group III-V nitride based.

In accordance with another aspect of the present invention, there is provided a method of manufacturing a semiconductor device, the method comprising
  providing a substrate;
  forming at least one active layer on said substrate;
  forming a Schottky contact on the at least one active layer by depositing a body of at least titanium and nitrogen in electrical contact with the at least one active layer.

The method may include the step of controlling the Schottky barrier height of the Schottky contact by controlling the quantity of nitrogen in the Schottky contact body.

The step of forming a Schottky contact may comprise formation by Physical Vapour deposition. In particular, the step of forming a Schottky contact may comprise depositing titanium by Physical Vapour Deposition (PVD) in an inert ambient environment, such as argon, and controlling the introduction of nitrogen into the ambient environment. The method may include the step of controlling the amount of nitrogen introduced into the ambient environment in which PVD is performed to provide control of the Schottky barrier height of the resultant semiconductor device. This step may form an aspect of the invention. Alternatively, the step may comprise PVD in which a TiWN sputter target is used rather than a TiW sputter target.

In particular, the ratio of nitrogen to inert ambient gas may be controlled. The body may comprise Titanium and Tungsten and nitrogen (TiW(N)).

The method may include the step of forming a Schottky contact stack comprising an active layer portion and a connection portion, wherein the body comprises the active layer portion of the stack and the connection portion has a lower resistance than the active layer portion. This may be advantageous when forming a Schottky HEMT for a switch application. In this case, the Schottky metal stack is used as a gate, where the total gate resistance is important for device performance, especially in high frequency RF applications.

The method may include the step of deposition of an electrically insulating material around the first contact to laterally delimit the first contact. The dielectric material may be an intermetal dielectric to electrically isolate the first contact. The dielectric material may be deposited by plasma enhanced chemical vapour deposition (PECVD). The dielectric material may comprise silicon oxide or a combination of a sub-layer of silicon oxide on a sub-layer of silicon nitride.

The method may include the step of depositing backend metal on the Schottky contact.

The Schottky contact may comprise TiW(N). The step of depositing the Schottky contact may comprise depositing a first TiW sub-layer; depositing a TiW(N) sub-layer over the first TiW sub-layer and depositing a second TiW sub-layer over the TiW(N) sub-layer.

The substrate may comprise a silicon substrate, a SiC substrate or a sapphire substrate. The at least one active layer may comprise a GaN layer. An AlGaN layer may be provided over the GaN layer, wherein the step of forming the first contact comprises forming said first contact on the AlGaN layer.

According to a third aspect of the invention we provide an integrated circuit (IC) including the semiconductor device as defined in the first aspect.

There now follows, by way of example only, a detailed description of embodiments of the invention with reference to the following figures, in which.

DETAILED DESCRIPTION OF THE DRAWINGS

Figure 1:
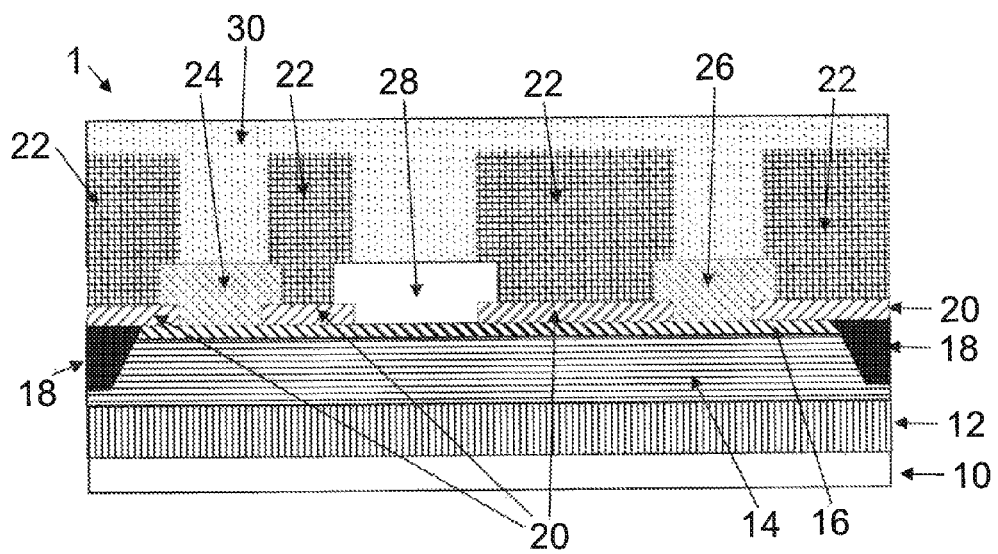
FIG. 1 shows schematically depicts a semiconductor device having a Schottky contact according to an embodiment of the present invention.

FIG. 1 shows a semiconductor device 1 comprising a Schottky contact of titanium tungsten and nitrogen TiW(N). It will be appreciated that the Schottky contact may comprise other materials, such as titanium nitride (TiN) among others. It has been found that such a contact forms an effective Schottky metal that is convenient to work with during fabrication in a mainstream silicon fabrication facility. It has further been found that control of the nitrogen content of the contact during fabrication provides a convenient way of controlling the electrical properties of the resulting electronic device and, in particular, the Schottky barrier height provided by the contact. TiW(N) has been found to be robust during subsequent processing steps in the formation of a semiconductor device, such as a diode, a transistor, HEMT and others. The present invention is particularly advantageous when applied to gallium nitride (GaN)-based semiconductor devices where mainstream Si-fab compatibility is required, for example GaN semiconductor devices for use in power, radio frequency (RF) and sensor applications.

FIG. 1 shows, schematically, an example of such a GaN-based semiconductor device 1. It should be understood that the Figures are merely schematic and are not drawn to scale. In particular, a HEMT is shown although the semiconductor device may comprise a diode or any other device. The semiconductor device comprises a substrate 10, such as a silicon substrate, onto which a buffer layer 12 is formed. The buffer layer 12 may for instance comprise GaN, AlGaN or a combination thereof. The semiconductor device comprises an active layer stack including a GaN layer 14 and an AlGaN layer 16. The semiconductor device may comprise isolation regions 18 to electrically separate adjacent semiconductor devices on a wafer. The isolation regions 18 for instance may be formed in any suitable manner, e.g. by etching a mesa into the active layer stack or by implanting an impurity such as argon into the active layer stack to locally disrupt the crystal structure such that the 2 dimensional electron gas can no longer form in this region. It should be understood that depending on the technology other types of isolation regions 18 may be used, e.g. using any suitable electrically insulating material such as silicon oxide, silicon-rich oxide, silicon nitride among others.

A passivation layer 20 is formed on the active layer stack 14, 16, which has been patterned to provide contact regions to the active layer stack. The passivation layer 20 may be any suitable dielectric material, such as silicon nitride. In this example, the semiconductor device is shown to have three contacts by way of non-limiting example only, namely ohmic contacts 24 and 26 and Schottky contact 28. It should however be understood that the semiconductor device may have any suitable number of contacts. The semiconductor device 1 may have only ohmic contacts or only Schottky contacts. The contacts 24, 26 and 28 are in conductive contact with the AlGaN layer 16 and are electrically insulated from each other by an electrically insulating material, such as dielectric material 22, which may comprise silicon nitride or any other suitable material. In an embodiment, the contacts 24, 26 and 28 are in physical contact with the AlGaN layer 16. In an alternative embodiment, the contacts 24, 26 and 28 are separated from the AlGaN layer 16 by an active layer capping layer to prevent reaction of the AlGaN layer 16 when exposing an intermediate structure to dry or wet etch chemistries, e.g. when forming the openings for the contacts 24, 26 and 28. Such an active layer capping layer should be thin enough to allow the contacts 24, 26 and 28 to be conductively coupled to the AlGaN layer 16. For example, the active layer capping layer may be a GaN layer having a thickness of less than 10 nm, e.g. 2-3 nm. Preferably, the passivation layer 20 and the dielectric material 22 are the same material, such as silicon nitride. However, the dielectric material may comprise Silicon Oxide.

The first ohmic contact 24 may define a source electrode of the semiconductor device, the second ohmic contact 26 may define a drain electrode of the semiconductor device and the Schottky contact 28 may define a gate electrode of the semiconductor device. The first and second ohmic contacts 24, 26 each are typically formed of an metallization stack including a Ti layer in physical contact with the AlGaN layer 16 and an Al layer in physical contact with the Ti layer. Further layers may be present in each of these contacts.

The Schottky contact 28 comprises a body of TiW(N), which forms the bulk of the contact or the bulk of the part of the contact that is coupled to the active layer. Thus, the TiW(N) metal is in physical contact with the AlGaN layer 16. A backend metallization 30 of the semiconductor device 1 is formed to facilitate the connection of the contacts 24, 26, 28 to other circuit elements or to the outside world. The process of manufacturing the metallization of a semiconductor device is commonly referred to as the back-end process.

Figure 2:
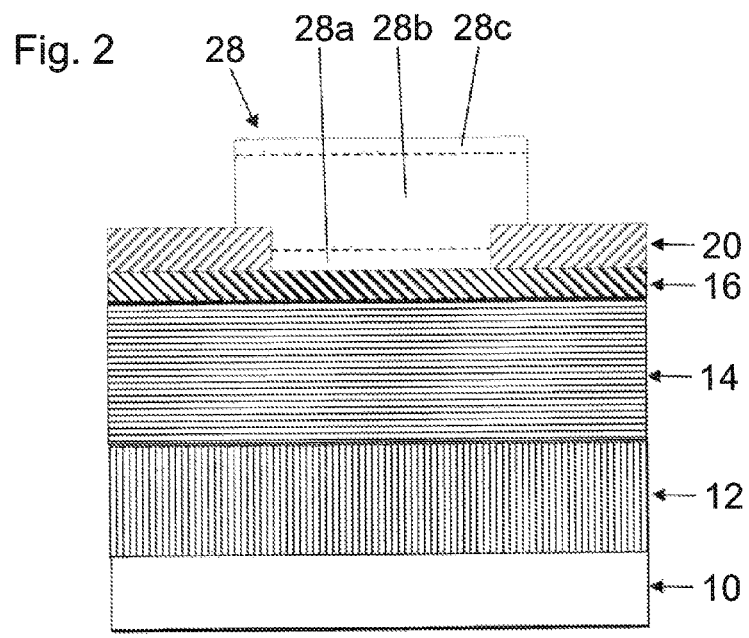
FIG. 2 show a schematic view of the Schottky contact of FIG. 1.

FIG. 2 shows the Schottky contact 28 in more detail. The contact 28 comprises a stack comprising a plurality of sub-layers. The contact comprises a first sub-layer 28a of TiW. The first sub-layer 28a comprises part of the contact 28 that is physically coupled to the active layer 16. The second sub-layer 28b comprises a TiW(N) layer. The third sub-layer 28c comprises a TiW layer. Thus, the TiW(N) layer is arranged between two TiW layers. As an example, the first sub-layer 28a may have a thickness of approximately 10 nm, the second sub-layer a thickness of 80 nm and the third sub-layer a thickness of 10 nm. Thus, the second sub-layer 28b of TiW(N) comprises the thickest layer such that its electrical properties dominate that of the stack. Thus, the majority of the contact comprises TiW(N). The sub-layers may be deposited conformally. In another example, a fourth sub-layer between the active layer and the first sub-layer is provided of Ti.

The use of TiW(N) or other nitrogen containing tungsten/titanium metal has been found to be advantageous as a Schottky metal and is straightforward to process during fabrication. Further, the nitrogen content of the Schottky metal provides a convenient means for tuning the Schottky barrier height of the Schottky contact 28.

For example, the nitrogen content of the TiW(N) Schottky contact 28 may be in the range of 30-60 atom % based on the total atom composition of the TiW(N) layer 28.

In another embodiment, the Schottky contact 28 may comprise only TiW(N) i.e. without the lower TiW sub-layer and the upper TiW sub-layer.

Providing a Schottky contact 28 of TiN or TiW(N) has been found to be useful for overcoming delamination between the Schottky contact 28 and the intermetal layer 22 and passivation layer 20, which was found to occur when the Schottky metal was nickel.

Figure 3:
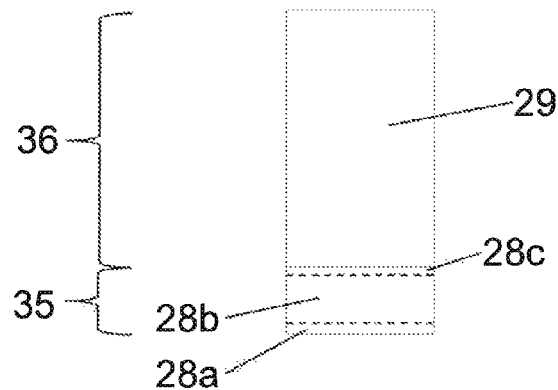
FIG. 3 shows a schematic view of a third example Schottky contact.

FIG. 3 shows a further embodiment of the Schottky contact 28. In FIG. 3, the Schottky contact 28 comprises an active layer portion 35, which provides the connection to the active layer 14, 16, and a contact portion 36, which provide a connection for the contact. The contact portion 36 is located on an opposite side of the active layer portion 35 to the active layer 14, 16. The active layer portion 35 comprises a stack as described above in relation to FIG. 2. Thus, rather than the whole contact comprising the TiW(N) stack described above, the stack forms a portion of the contact that provides an interface to the active layer and the contact portion 36 forms the remainder of the contact 28.

The contact portion 36 comprises a material of lower resistance than the active layer portion 35, which in this example comprises Aluminium. This may be advantageous when forming a Schottky HEMT for a switch application. In this case, the total gate resistance may be important for device performance, especially in high frequency RF applications. Thus, providing a contact 28 having an active layer portion 35, which contains a controllable amount of nitrogen to tune the Schottky barrier height and acts to prevent delamination, and a connection portion 36 of lower resistance such that the overall resistance of the contact is lower may be advantageous. As an example, the first sub-layer 28a may have a thickness of approximately 10 nm, the second sub-layer a thickness of 80 nm, the third sub-layer a thickness of 10 nm and the connection portion of Aluminium a thickness of approximately 75 nm. The contact portion may have a thickness of at least 75 nm or may have a thickness in the range of 50-150 nm. The contact portion may comprise a thickness substantially half of the total contact 28 thickness.

Figure 4:
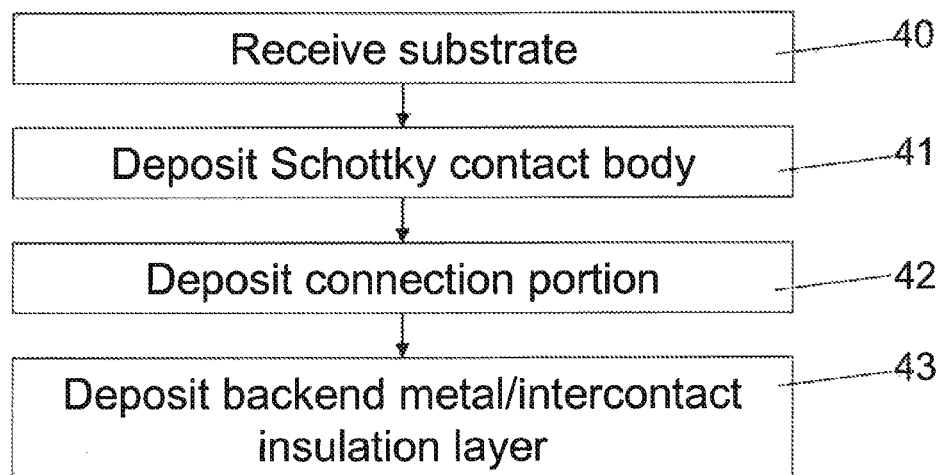
FIG. 4 shows a flow chart illustrating a method of fabrication of the semiconductor device.

FIG. 4 shows a flow chart illustrating a method of fabrication of a semiconductor device including a step of controlling the Schottky barrier height during fabrication of a semiconductor device. Step 40 shows receipt of a substrate comprising an active layer. Step 41 shows deposition of the Schottky contact body, which in this example comprises a TiW(N) stack as described above.

Step 41 may be performed by depositing titanium tungsten by Physical Vapour Deposition (PVD) in an inert ambient environment, such as argon, and introducing nitrogen into the ambient environment. Thus, step 41 comprises controlling the amount of nitrogen introduced into the argon ambient environment in which PVD is performed to provide control of the Schottky barrier height of the resultant semiconductor device. Thus, the step may involve determining a desired Schottky barrier height, determining the ratio of argon to nitrogen ambient to achieve the desired Schottky barrier height and controlling the PVD tool to achieve the desired ambient nitrogen-argon ratio.

As an example, an argon/nitrogen ratio of 0.5 may yield an atom % nitrogen content of 55-60; an argon/nitrogen ratio of 1.1 may yield an atom % nitrogen content of 45-55; and an argon/nitrogen ratio of 2.8 may yield an atom % nitrogen content of 35-40.

Step 42 shows deposition of the connect portion 36 of Aluminium over the active layer portion formed in step 41. The method may proceed to deposition of the backend metallisation over the Schottky contact and intercontact insulating material in step 43. It will be appreciated that other steps may be involved in the fabrication of the semiconductor device. For example, the process may include the steps of providing a GaN substrate, applying a silicon nitride passivation layer, formation of ohmic contacts, applying isolation, formation of the Schottky contacts and so on.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A semiconductor device comprising at least one active layer on a substrate and a Schottky contact to the at least one active layer, the Schottky contact comprising a body of at least titanium and nitrogen that is electrically coupled with the at least one active layer;
in which the body of the Schottky contact comprises a first TiW sub-layer nearest to the at least one active layer, a second TiW sub-layer farthest from the at least one active layer, and a TiW(N) sub-layer in-between the first and second TiW sub-layers.

2. A semiconductor device according to claim 1, in which the TiW(N) sub-layer has a thickness exceeding the combined thickness of the first and second TiW sub-layers such that the properties of the sub-layer stack are dominated by the TiW(N) sub-layer.

3. A semiconductor device according to claim 1, in which the Schottky contact comprises a stack having an active layer portion adapted to be coupled to the at least one active layer and a connection portion coupled to the active layer portion for providing a connection to the Schottky contact, wherein the body forms the active layer portion and the connection portion has a lower resistance than the active layer portion.

4. A semiconductor device according to claim 3, in which the connection portion comprises Aluminium.

5. A semiconductor device according to claim 1, in which the Schottky contact is laterally delimited by an electrically insulating material.

6. A semiconductor device according to claim 1, in which the semiconductor device comprises a gallium nitride active layer.

7. An integrated circuit including the semiconductor device as defined in claim 1.

\* \* \* \* \*